United States Patent
Baecker et al.

(10) Patent No.: US 6,638,568 B1
(45) Date of Patent: Oct. 28, 2003

(54) METHOD FOR CURING CRACKS IN CERAMIC SHAPED BODIES AND SHAPED BODIES TREATED IN SUCH A MANNER

(75) Inventors: Michael Baecker, Cologne (DE); Joachim Bock, Erftstadt (DE); Herbert C. Freyhardt, Goettingen (DE); Andreas Leenders, Goettingen (DE); Heribert Walter, Goettingen (DE); Martin Ullrich, Langgoens (DE)

(73) Assignee: Nexans Superconductors GmbH, Huerth (DE)

( * ) Notice: Subject to any disclaimer, the term of this patent is extended or adjusted under 35 U.S.C. 154(b) by 0 days.

(21) Appl. No.: 09/787,107
(22) PCT Filed: Sep. 10, 1999
(86) PCT No.: PCT/EP99/06677
§ 371 (c)(1), (2), (4) Date: Jul. 31, 2001
(87) PCT Pub. No.: WO00/15581
PCT Pub. Date: Mar. 23, 2000

(30) Foreign Application Priority Data

Sep. 14, 1998 (DE) .......................................... 198 41 925

(51) Int. Cl.$^7$ .............................. B05D 1/00; B05D 3/02; B05D 7/22
(52) U.S. Cl. ........................ 427/140; 427/127; 427/128; 427/62; 427/63; 427/64; 427/180; 427/181; 427/189; 427/226; 427/230; 427/287; 427/256; 427/283
(58) Field of Search ................................. 427/140, 127, 427/128, 62, 63, 64, 180, 181, 189, 226, 230, 287, 256, 283

(56) References Cited

U.S. PATENT DOCUMENTS

| | | | | |
|---|---|---|---|---|
| 4,330,572 A | * | 5/1982 | Frosch et al. ................ | 427/140 |
| 4,804,562 A | * | 2/1989 | Ferguson et al. ............ | 427/140 |
| 5,858,144 A | * | 1/1999 | Barton et al. ................ | 156/89.28 |
| 6,127,005 A | * | 10/2000 | Lehman et al. .............. | 427/553 |

FOREIGN PATENT DOCUMENTS

| | | |
|---|---|---|
| EP | 0 610 556 A1 | 8/1994 |
| GB | 2 173 715 A | 10/1986 |

OTHER PUBLICATIONS

Patent Abstracts of Japan, vol. 014, No. 413 (JP 02 158009), Jun. 1990.

* cited by examiner

Primary Examiner—Shrive P. Beck
Assistant Examiner—Jennifer Kolb Michener
(74) Attorney, Agent, or Firm—Sughrue Mion, PLLC

(57) ABSTRACT

A method of curing cracks in a ceramic shaped body made from ceramic magnet materials or ceramic superconductor materials, in which a filling material which melts at a lower temperature than the material of the shaped body or is flowable at a lower temperature than the material of the shaped body is applied to the surface of the shaped body at least in the area of a crack and/or is introduced into at least one crack, in which the shaped body with the filling material is heated to and maintained at a temperature at which the material of the shaped body does not yet melt or is not yet flowable, but at which the filling material is in at least partially molten and flowable state at least until the fused filling material can penetrate at least partially into the crack, in which the filling material consists of non-metallic or essentially of non-metallic compounds and is at least partially crystallized, and in which the shaped body with the filling material is cooled, wherein the thermal crystallization conditions for the filling material are selected in such a way that the filling material grows epitaxially on the crack face.

24 Claims, No Drawings

METHOD FOR CURING CRACKS IN CERAMIC SHAPED BODIES AND SHAPED BODIES TREATED IN SUCH A MANNER

The invention relates to a method for curing cracks in ceramic materials, which is especially suitable for improving the mechanical and, where appropriate, also the magnetic properties of a corresponding specimen body.

The method is in principle suitable for all ceramic materials, but is intended for those of fairly high relative density. In this way, it is possible to improve the mechanical properties and, where appropriate, also the surface quality in particular for surfaces on which finishing is carried out. In the case of superconducting materials, it is thereby additionally possible to improve the superconducting and magnetic properties as well. In the same way, it may also be used for non-superconducting ceramic magnet materials. Particular advantages are obtained when textured polycrystalline materials or superconducting materials having only a few magnetic domains are used.

In the case of brittle inorganic materials, it is almost impossible to fully avoid cracks, which here also include microcracks. They can occur, in particular, as a result of mechanical stresses in the component before, during or after the heat treatment, as a result of a heat treatment, as a result of structural stresses—especially when phases with significantly different thermal expansion differences are present— as a result of phase reorganizations or as a result of impact or similar mechanical action.

These cracks may be macroscopically detectable in the components. It is precisely the deeper cracks that extend over larger distances which are often open somewhat wider and are therefore often detectable without visual aids or without a crack test using penetration agents. As a result of many studies, it is known that cracks, including microcracks, deteriorate the mechanical properties. It is already possible to study the effect of cracks according to length, direction and size in flexural or tensile specimens, and to determine their sometimes critical effect. Partial or complete curing of the cracks can therefore significantly improve the mechanical properties of shaped bodies, including components.

Another possible way of detecting cracks is possible in magnetic shaped bodies by recording the remanent induction, especially with a two-dimensional measurement. In this case, separation of magnetic domains often occurs as a result of cracks. If it were possible to join together the structural components, or grain segments, which have been separated by a crack and have an identical or virtually identical alignment, and to cure the areas, respectively neighboring subdomains could be coalesced to form a new domain.

The object was therefore to propose a method by which the cracks in ceramic shaped bodies can be at least partially closed.

The object is achieved by a method for curing cracks in ceramic shaped bodies,
  in which a filling material which melts at a lower temperature than the material of the shaped body and/or is flowable at a lower temperature than the material of the latter is applied to the surface of the shaped body at least in the area of a crack and/or is introduced into at least one crack,
  in which the shaped body with the applied and/or introduced filling material is heated to a temperature at which the material of the shaped body does not yet melt and/or is not yet flowable, but at which the filling material is in the at least partially molten and flowable state,
  in which the filling material consists of nonmetallic or essentially of nonmetallic compounds and is at least partially crystallized, and in which the shaped body with the filling material is cooled.

If the filling material consists essentially of nonmetallic compounds, a noble metal content, especially silver, gold, platinum and/or palladium, of overall up to 25% by weight may also be included. This content preferably constitutes overall up to 10% by weight and occurs especially in the high-temperature superconductor materials.

The method according to the invention is advantageously implemented in such a way that the flowable filling material penetrates at least partially into a crack and/or into an area of the shaped body that has been removed e.g. by a saw cut.

The material of the shaped body is preferably selected from the group comprising silicate ceramics such as cordierites, steatites and porcelains, oxide ceramics such as aluminum oxides, magnesium oxides and titanates, nitride or carbide ceramics such as silicon carbides and silicon nitrides, ceramic magnet materials such as hexaferrites or ceramic superconductor materials, in particular ceramic high-temperature superconductor materials.

The material of the shaped body and/or the filling material preferably essentially consist of chemical elements selected from the group comprising Mg, Ca, Sr, Ba, Sc, Y, La, lanthanides, Zr, Hf, Pt, Pd, Ag, Cu, Hg, Ag, Tl, Pb, Bi, S and O, where proportions of these chemical elements may be substituted by others which have not been mentioned. Relevant lanthanides include all chemical elements of this class.

The material of the shaped body and/or the filling material is preferably selected from the group of materials based on Bi—AE—Cu—O, (Bi,Pb)—AE—Cu—O, Y—AE—Cu—O, (Y,RE)—AE—Cu—O, RE—AE—Cu—O, Tl—AE—Cu—O, (Tl,Pb)—AE—Cu—O and Tl—(Y,AE)—Cu—O, where proportions of these chemical elements may be substituted by others which have not been mentioned and AE stands for at least one alkaline earth element.

The method according to the invention is especially favorable if a filling material is used in which at least two of the lattice parameters of the crystal lattice of one main phase of the filling material are sufficiently similar to those of one of the main phases of the material of the shaped body, in particular so as to permit epitaxial growth.

All forms of shaped bodies are in principle suitable. The preferred and currently usual ones are those which are essentially in the form of plates, round pieces, blocks, solid cylinders, hollow cylinders, rings, tubes or coils, where there may be deviated angles, broken edges, rounded edges, additional recesses such as e.g. bores and grooves as well as additional protruding parts such as extensions, points and similar geometrical variations.

A favorable shaped body is a semi-sintered, sintered or fused ceramic body having a relative density of at least 80%, particularly preferably of at least 95%, although in exceptional cases even less dense shaped bodies may offer advantages when they are treated according to the invention.

The filling material may contain a subsidiary proportion of a metal or of several metals. The main phase or the main phases of the filling material are, however, inorganic nonmetallic compounds.

A suitable filling material is, in particular, a powder or powder mixture which may optionally be mixed with known agents such as water and/or other solvents, plasticizers etc. in a well-known way, and which can be introduced at the surface onto and/or into the cracks, or areas that have been removed. A further especially suitable filling material is a pressed, calcined, sintered or fused shaped body which is put onto the shaped body or is fastened to it. A combination of a powder/powder mixture with a shaped body applied in this way is especially preferred. However, the filling material may also be applied, where appropriate additionally, in the form of a coating, in which case all known coating methods are in principle suitable although attention must be paid to the requisite layer thickness when selecting the coating method.

The filling material preferably has a melting point which is lower than that of the material of the shaped body by at least 5° C., particularly preferably by at least 10° C. and more particularly preferably by at least 20° C. The difference between the melting points must be commensurately greater when the control over the temperature when firing is less accurate and/or when the temperature variations inside the batch space of a kiln are large, in particular during the holding time.

The filling material preferably displays softening behavior, in which the filling material, which is at least partially molten and flowable, has such a viscosity at least 10° C. lower than the material of the shaped body, particularly preferably at least 20° C. lower and more particularly preferably at least 30° C. lower. In this case, it is necessary to bear in mind that a supporting framework of solid particles, which may possibly be connected to one another, can substantially influence the viscosity of the flowable filling material, or of the material of the shaped body. For the kiln used and the batch selected, it is necessary to ensure that the material of the shaped body still retains sufficient dimensional stability at the selected treatment temperature, whereas the filling material has a viscosity low enough for it to flow and penetrate into at least wide cracks and into wide areas that have been removed, but is not so mobile that it can seep back out of the cracks after penetration and leave them unfilled. In the latter case, it may therefore be important to increase the viscosity by modifying the chemical composition or lowering the temperature, in particular if the cracks or the areas that have been removed have a fairly large width.

A difference in the melting temperature and/or in the softening behavior can be adjusted in various ways:

An extrinsic or substantially extrinsic material with corresponding physico-chemical properties may be used as the filling material, such as e.g. an aluminum oxide material supplemented with one or more percent by weight of $SiO_2$ and/or MgO, which may for example be used as the filling material for a shaped body made of a silicon nitride material. In this case, the silicon nitride material may, but does not have to, include $Al_2O_3$ contents. A certain chemical affinity and/or reactivity between the filling material and the material of the shaped body is in this case advantageous.

An intrinsic or substantially intrinsic material may be used, such as e.g. an aluminum oxide material supplemented with one or more percent by weight of $SiO_2$ and/or MgO, which may for example be used as the filling material for a shaped body made of an aluminum oxide material without, or with only small proportions of $SiO_2$ and/or MgO.

The filling material may have a lower melting point or a lower viscosity than the material of the shaped body, because the filling material e.g. as a result of:

a higher content of an additive that is the same as in the material of the shaped body and lowers the melting point or the viscosity e.g. under eutectic or peritectic conditions, and the same main phase(s) as in the material of the shaped body, a content of an additive which is included only at a subsidiary level or not at all, in the material of the shaped body and lowers the melting point or the viscosity e.g. under eutectic or peritectic conditions, and on account of the content of the same main phase(s), a higher content of an additive that is the same as in the material of the shaped body and lowers the melting point or the viscosity e.g. under eutectic or peritectic conditions, but with other main phases being present than in the material of the shaped body, the fact that the main phase(s) of the filling material is/are identical or substantially identical to at least one additive in the material of the shaped body, which lowers the melting point or the viscosity e.g. under eutectic or peritectic conditions, the fact that the main phase(s) of the filling material has/have a chemical composition which is modified, compared with the main phase(s) in the material of the shaped body, by partial substitution or exchange of related chemical elements, this modification lowering the melting point or the viscosity e.g. under eutectic or peritectic conditions.

If aluminum oxide ceramic or silicon nitride ceramic is used as the material of the shaped body then the filling material, for example based on aluminum oxide, may be supplemented with one or more additives that lower the melting point.

If superconducting materials are used, the filling material may e.g. be richer in elements, substituted elements or additives which lower the melting point or the viscosity.

For a filling material based on YBCO, it is for example advantageously possible to partially or fully use ytterbium and/or other lanthanides which provide lower-melting and/or less viscous compounds, instead of yttrium. In this case, it is necessary to bear in mind that the respective compounds $RE_1Ba_2Cu_3O_y$ and $Y_1Ba_2Cu_3O_y$ have melting points at respectively about 1085° C., 1060° C., 1000° C. and 900° C. in the sequence Nd, Sm, Y/Yb for the 123 phase. Therefore, in the case of a material of a shaped body based on NdBCO, it is possible to partially or fully replace Nd by Sm, Y and/or Yb for an intrinsic or quasi-intrinsic filling material.

For a filling material based on BSCCO, it is for example advantageously possible to partially use lead or antimony instead of bismuth, or a modified Sr:Ca ratio. A material of the shaped body based on BSCCO, having a content in excess of 8% by weight of a high-melting alkaline earth metal sulfate such as e.g. $SrSO_4$, has a higher viscosity merely as a result of a framework comprising sulfate particles, so that a BSCCO material free from alkaline earth metal sulfates may be used as the filling material.

For a filling material based on Tl superconductors, it is for example advantageously possible to partially use lead or antimony instead of thallium, or a modified Ba:Ca ratio.

The filling material may already start to crystallize out at the treatment temperature, in particular if chemical reactions in the filling material and/or with the material of the shaped body are involved. In most cases, the crystallization of the filling material takes place at a slightly lowered temperature, preferably either during slow cooling or at a correspondingly selected temperature plateau. The at least partial crystallization is advantageous so as to form a structure with especially good mechanical stability or maximally monocrystalline areas, which have an advantageous effect on the other properties of the shaped body, e.g. on the magnetic properties. The crystallization is especially advantageous if it takes place epitaxially on the material of the shaped body.

For this purpose, an especially long holding time and/or especially slow cooling is helpful in many cases so as to permit both nucleation and unperturbed epitaxial growth. If the orientation of the crystallized filling material is well-matched to that of the neighboring material of the shaped body, the properties obtained with the shaped body according to the invention will be commensurately better. In this case, it is advantageous if the crystallized filling material extends as deeply as possible into the crack or area that has been removed.

In a preferred embodiment, especially if a shaped body is present which has only a few grains and/or only a few magnetic domains, a crack, a grain boundary and/or a contaminated or structurally impaired area is removed, in particular by sawing, in which case the area that has been removed is subsequently treated as a crack in the rest of the method according to the invention. This makes it possible, inter alia, to fully cure defective shaped bodies, or to produce especially large shaped bodies having better properties than is technically possible at present.

In many cases, it may be sufficient if the crack is only closed at the surface, in the case of especially narrow cracks in particular. Advantageously, however, at least certain cracks and areas that have been removed are also at least partially filled deeply, which may be done by keeping the shaped body with the filling material at the temperature at least until the flowable filling material can penetrate at least partially into a fairly wide crack or into an area that has been removed. The more the face of the crack or of the area that has been removed is filled, the greater will be the improvement in the magnetic properties of a superconducting material. It is therefore advantageous if at least the top 3 mm, preferably at least the top 5 mm and particularly preferably at least the top 8 mm, from the surface into the depth of the shaped body, is treated according to the invention, and if cracks and areas that have been removed are filled as far as possible to this depth.

In many combinations between the material of the shaped body and the filling material, it is appropriate to limit the holding time at the maximum temperature of the treatment according to the invention in the range of from at least 5 minutes to at most 2 hours, preferably from at least 10 minutes to at most 1 hour, in particular so as to let the flowable filling material flow but to prevent softening of the shaped body.

Conversely, in other combinations between the material of the shaped body and the filling material, the holding time at the maximum temperature of the treatment according to the invention may be virtually zero if the melting points and/or the softening temperatures of the respective main phases are very far apart, and if the heating and cooling rate is sufficient for flow of the filling material close to the highest temperatures.

If softening of the shaped body at the maximum temperature of the treatment according to the invention can be safely ruled out, the holding time may also be selected with a correspondingly longer value.

The method according to the invention works especially well if the thermal crystallization conditions for the filling material are selected in such a way that the filling material grows epitaxially on the crack face, on the surface of an area that has been removed and/or the surface of the shaped body. This is true in particular of shaped bodies having one or a few grains, or magnetic domains, since the curing of the area of the split (crack, area with impurities and/or structural impairments etc.) then greatly improves the properties of the shaped body, in particular if a high fill factor is achieved.

In the case of superconducting materials, it is often necessary for the shaped body with the heated filling material to be thermally re-treated in a gas containing oxygen, so as to improve the superconducting properties.

For shaped bodies whose surfaces require a certain surface quality, e.g. a mean roughness value $R_a$ of particular size or, as functional faces, a particular shape of the Abbot's load curve, or whose geometry needs to comply with certain values of lengths, angles and/or shape and position tolerances, such as e.g. being planar or parallel, it is often necessary for mechanical surface finishing to be carried out on the shaped body with the heated filling material after cooling, e.g. by grinding, lapping, polishing and/or tumbling. In this case, it may also be expedient to chamfer or round off sharp edges by grinding, or round them off by tumbling.

In order to improve the magnetic properties in the case of hard ferrites or in the case of superconductors, it may be advantageous to use a shaped body which has only a few magnetic domains. By implementing the method according to the invention, the number of these domains can be reduced and the magnetic properties, in particular the levitation force and the maximum remanent induction, can be improved.

Such shaped bodies, possessing only one grain or a few grains, or only one magnetic domain or a few magnetic domains, are preferably produced in a modified melt texture growth process, in a top-seeded melt growth process or in a zone refining process. Specimen bodies that have been produced in one of these methods often have only about one to six magnetic domains. If such specimens have cracks and/or contaminated or structurally impaired areas, these defects can be cured by the method according to the invention, and the cleaved magnetic domains can also be cured.

Suitable high-temperature superconducting materials for the method according to the invention are those in which the material of the shaped body and/or the filling material contains phases which are selected from the group of phases having an approximate composition $Y_1Ba_2Cu_3O_v$, $Y_2Ba_1Cu_1O_w$, $Yb_1Ba_2Cu_3O_{v'}$, $Yb_2Ba_1Cu_1O_{w'}$, $Sm_1Ba_2Cu_3O_{v''}$, $Sm_2Ba_1Cu_1O_{w''}$, $Nd_1Ba_2Cu_3O_{v'''}$, $Nd_4Ba_2Cu_2O_{w'''}$, $Y_2O_3$, $CeO_2$, $PtO_2$, Ag and $AgO_2$, where Y, Yb, Sm and/or Nd may also be partially substituted by other lanthanides or Y and where other related chemical elements may also occur in Ag and/or $Ago_2$.

The material of a high-temperature superconducting shaped body and/or the filling material may contain phases which are selected from the group of phases having an approximate composition $Bi_2(Sr,Ca)_2Cu_1O_x$, $(Bi,Pb)_2(Sr,Ca)_2Cu_1O_x$, $Bi_2(Sr,Ca)_3Cu_2O_{x''}$, $(Bi,Pb)_2(Sr,Ca)_3Cu_2O_{x'''}$, $Bi_2(Sr,Ca)_4Cu_3O_{x''''}$, $(Bi,Pb)_2(Sr,Ca)_4Cu_3O_{x''''}$, where Bi, Pb, Sr and Ca may also be partially substituted by individual other chemical elements.

The material of a high-temperature superconducting shaped body and/or the filling material may furthermore contain phases which are selected from the group of phases having an approximate composition $(Tl,Pb)_2(Ba,Ca)_2Cu_1O_y$, $(Tl,Pb)_2(Ca,Ba)_4Cu_3O_{y'}$, $(Tl,Pb)_2(Ca,Ba)_3Cu_4O_{y''}$, $(Tl,Pb)_1(Ca,Ba)_3Cu_2O_{y'''}$ and $(Tl,Pb)_1(Ca,Ba)_4Cu_3O_{y''''}$, where individual ones of the listed chemical elements may be partially substituted by other chemical elements.

It is known that all these superconducting phases often have a composition which deviates significantly from the stoichiometry of the respective general formula. The person skilled in the art knows in principle about the composition of these phases and the substitution by other chemical elements.

The shaped bodies produced according to the invention may, for example, be used for transformers, circuit breakers, supply leads, magnetic screens, magnetic bearings and/or as magnets for various purposes.

EXAMPLES

The invention will be presented below by way of example:

Example 1

The material of a shaped body based on the high-temperature superconducting initial composition $Y_1Ba_2Cu_3O_y$ with 25 mol % $Y_2O_3$ and 1 mol % $CeO_2$ was produced at temperatures up to 1045° C. by a top-seeded melt growth (TSMG) process. The structure consisted of YBCO 123 with a high density of ultrafine YBCO 211 particles. A plurality of specimen bodies were in the form of a plate measuring 38×38 mm and 12 mm in height, among which two specimen bodies had, laterally with respect to the center or almost centrally, a deep crack approximately 10 μm wide running essentially in a straight line. This crack degraded the magnetic properties of the corresponding specimen bodies. The pictorial representation of the remanent induction over the large face of the plate showed in each case a significant property drop in the area of the crack.

A filling material of the initial composition $Yb_1Ba_2Cu_3O_y$ was converted into a very fine-grained powder by fine grinding, and was spread onto the surface of the specimen body in the form of a thin band over the crack. In this case, the filling material was supplied in a very high volume excess, which may possibly also have the advantage that ytterbium can be incorporated into the YBCO crystal lattice as a result of diffusion. The specimen bodies prepared in this way were heated with the filling material to 970° C., kept at this temperature for 12 minutes and subsequently cooled, a ten to fifty hour holding time having in each case been maintained at 943, 940 and 900° C. and the temperature having also been reduced slowly over 50 hours in between, so as to bring about nucleation and maximally epitaxial crystallization. These times may, however, be further reduced considerably. The specimens were then cooled slowly to room temperature. The holding time at the maximum temperature was kept comparatively short so as to avoid any noticeable growth of $Y_2Ba_1Cu_1O_w$ particles as well as softening of the specimen body.

The specimen bodies cured in this way showed a properly and uniformly filled crack, even in the lowermost part of the crack, and now displayed a uniform picture of the magnetic properties when measuring the remanent induction, which then had only a single magnetic domain without any perturbation or deterioration. Whereas the magnetic remanent induction before curing the crack running laterally through the specimen was 625 mT for one of the specimen bodies, the curing enabled it to be increased to 644 mT.

What is claimed is:

1. A method for curing cracks in a ceramic shaped body, wherein the ceramic shaped body is made from a material selected from the group consisting of ceramic magnet materials and ceramic superconductor materials, in which a filling material which melts at a lower temperature than the material of the shaped body or is flowable at a lower temperature than the material of the shaped body is applied to the surface of the shaped body at least in the area of a crack and/or is introduced into at least one crack, in which the shaped body with the applied and/or introduced filling material is heated to a temperature at which the material of the shaped body does not yet melt or is not yet flowable, but at which the filling material is in an at least partially molten and flowable state, in which the filling material consists of non-metallic or essentially of non-metallic compounds and is at least partially crystallized, and in which the shaped body with the filling material is cooled, wherein the shaped body with the filling material is kept at the temperature at which the material of the shaped body does not yet melt or is not flowable, but at which the filling material is in the at least partially molten and flowable state, at least until the fused filling material can penetrate at least partially into the crack or into an area that has been removed, and wherein the thermal crystallization conditions for the filling material are selected in such a way that the filling material grows epitaxially on the crack face.

2. The method as claimed in claim 1, wherein the material of the shaped body is a ceramic high-temperature superconductor material.

3. The method as claimed in claim 1, wherein at least one of the material of the shaped body and the filling material is selected from the group consisting of materials based on Bi—AE—Cu—O, (Bi, Pb)—AE—Cu—O, Y—AE—Cu—O, (Y, RE)—AE—Cu—O, RE—AE—Cu—O, Tl—AE—Cu—O, (Tl, Pb)—AE—Cu—O and Tl—(Y, AE)—Cu—O, where AE stands for at least one alkaline earth element.

4. The method as claimed in claim 1, wherein a filling material is used in which at least two of the lattice parameters of the crystal lattice of one of the main phases of the filling material are sufficiently similar to those of one of the main phases of the material of the shaped body.

5. The method as claimed in claim 1, wherein the shaped body is essentially in the form of plates, round pieces, blocks, solid cylinders, hollow cylinders, rings, tubes or coils.

6. The method as claimed in claim 1, wherein the shaped body is a semisintered, sintered or fused ceramic body having a relative density of at least 80%.

7. The method as claimed in claim 1, wherein the shaped body is a semisintered, sintered or fused ceramic body having a relative density of at least 90%.

8. The method as claimed in claim 1, wherein the filling material is selected from the group consisting of a powder, a pressed, calcined, sintered or fused shaped body and a coating.

9. The method as claimed in claim 1, wherein at least one of a crack, a grain boundary and a contaminated or structurally impaired area is removed and wherein the area that has been removed is subsequently treated as the crack referred to in claim 1.

10. The method as claimed in claim 9, wherein the area with the crack, the grain boundary or the contaminated or structurally impaired area is removed by sawing.

11. The method as claimed in claim 1, wherein the shaped body is enriched with oxygen during the cooling and/or during a subsequent heat treatment, and in which a superconductive phase is formed.

12. The method as claimed in claim 1, wherein the shaped body with the heated filling material is thermally re-treated in a gas containing oxygen, so as to improve the superconducting properties.

13. The method as claimed in claim 1, wherein mechanical surface finishing is carried out on the shaped body with the heated filling material.

14. The method as claimed in claim 1, wherein a shaped body is used which has one to six magnetic domains.

15. The method as claimed in claim 1, wherein a shaped body is used which has been produced in a modified melt texture growth process or in a top-seeded melt growth process.

16. The method as claimed in claim 1, wherein cleaved magnetic domains are cured.

17. The method as claimed in claim 1, wherein the material of at least one of the shaped body and the filling material contains phases which are selected from the group consisting of phases having a composition consisting essentially of $Y_1Ba_2Cu_3O_v$, $Y_2Ba_1Cu_1O_w$, $Yb_1Ba_2Cu_3O_{v'}$, $Yb_2Ba_1Cu_1O_{w'}$, $Sm_1Ba_2Cu_3O_{v''}$, $Sm_2Ba_1Cu_1O_{w''}$, $Nd_1Ba_2Cu_3O_{v'''}$, $Nd_4Ba_2Cu_2O_{w'''}$, $Y_2O_3$, $CeO_2$, $PtO_2$, Ag and $AgO_2$, where at least one element selected from the group consisting of Y, Yb, Sm and Nd may also be partially substituted by at least one different element selected from the group consisting of other lanthanides and Y and where other related chemical elements may also occur in Ag and/or $AgO_2$.

18. The method as claimed in claim 1, wherein the material of at least one of the shaped body and the filling material contains phases which are selected from the group consisting of phases having a composition consisting essentially of $Bi_2(Sr,Ca)_2Cu_1O_x$, $(Bi,Pb)_2(Sr,Ca)_2Cu_1O_{x'}$, $Bi_2(Sr,Ca)_3Cu_2O_{x''}$, $(Bi,Pb)_2(Sr,Ca)_3Cu_2O_{x'''}$, $Bi_2(Sr,Ca)_4Cu_3O_{x''''}$, $(Bi,Pb)_2(Sr,Ca)_4Cu_3O_{x'''''}$, where Bi, Pb, Sr and Ca may also be partially substituted by individual other chemical elements.

19. The method as claimed in claim 1, wherein the material of at least one of the shaped body and the filling material contains phases which are selected from the group consisting of phases have a composition consisting essentially of $(Tl,Pb)_2(Ba,Ca)_2Cu_1O_y$, $(Tl,Pb)_2(Ca,Ba)_4Cu_3O_{y'}$, $(Tl,Pb)_2(Ca,Ba)_3Cu_4O_{y''}$, $(Tl,Pb)_1(Ca,Ba)_3Cu_2O_{y'''}$, and $(Tl,Pb)_1(Ca,Ba)_4Cu_3O_{y''''}$, where individual ones of the listed chemical elements may be partially substituted by other chemical elements.

20. A shaped body having only one or up to 8 grains, in which at least one crack or at least one contaminated or structurally impaired area which was previously removed from the shaped body has been cured by the method of claim 1 for curing cracks in a ceramic shaped body that is made of a ceramic magnet material or ceramic superconductor material, in which a filling material which melts at a lower temperature than the material of the shaped body or is flowable at a lower temperature than the material of the shaped body is applied to the surface of the shaped body at least in the area of a crack and/or is introduced into at least one crack, in which the shaped body with the applied and/or introduced filling material is heated to a temperature at which the material of the shaped body does not yet melt or is not yet flowable, but at which the filling material is in an at least partially molten and flowable state, in which the filling material consists of non-metallic or essentially of non-metallic compounds and is at least partially crystallized, and in which the shaped body with the filling material is cooled.

21. The shaped body as claimed in claim 20, wherein the area with the crack or the contaminated or structurally impaired area was previously removed by sawing.

22. A magnetic shaped body having only one or up to 8 magnetic domains, in which at least one crack or a contaminated or structurally impaired area which was previously removed from the shaped body has been cured by the method of claim 1 for curing cracks in a ceramic shaped body that is made of a ceramic magnet material or ceramic superconductor material, in which a filling material which melts at a lower temperature than the material of the shaped body or is flowable at a lower temperature than the material of the shaped body is applied to the surface of the shaped body at least in the area of a crack and/or is introduced into at least one crack, in which the shaped body with the applied and/or introduced filling material is heated to a temperature at which the material of the shaped body does not yet melt or is not yet flowable, but at which the filling material is in an at least partially molten and flowable state, in which the filling material consists of non-metallic or essentially of non-metallic compounds and is at least partially crystallized, and in which the shaped body with the filling material is cooled.

23. The shaped body as claimed in claim 22, wherein the area with the crack or the contaminated or structurally impaired area was previously removed by sawing.

24. A method of using a shaped body, comprising producing a transformer, circuit breaker, supply lead, magnetic screen, magnetic bearing or magnet from a shaped body, wherein the shaped body is produced by the method of claim 1 for curing cracks in a ceramic shaped body that is made of a ceramic magnet material or ceramic superconductor material, in which a filling material which melts at a lower temperature than the material of the shaped body or is flowable at a lower temperature than the material of the shaped body is applied to the surface of the shaped body at least in the area of a crack and/or is introduced into at least one crack, in which the shaped body with the applied and/or introduced filling material is heated to a temperature at which the material of the shaped body does not yet melt, or is not yet flowable, but at which the filling material is in an at least partially molten and flowable state, in which the filling material consists of non-metallic or essentially of non-metallic compounds and is at least partially crystallized, and in which the shaped body with the filling material is cooled; and wherein the material of the shaped body is a ceramic high-temperature superconductor material.

* * * * *